(12) United States Patent
Peng et al.

(10) Patent No.: US 9,263,230 B2
(45) Date of Patent: Feb. 16, 2016

(54) METHOD FOR TRANSMITTING A BROADBAND ION BEAM AND ION IMPLANTER

(75) Inventors: Libo Peng, Beijing (CN); Huiyue Long, Beijing (CN); Junyu Xie, Beijing (CN)

(73) Assignee: Beijing Zhongkexin Electronics Equipment Co., Ltd., Beijing (CN)

( * ) Notice: Subject to any disclaimer, the term of this patent is extended or adjusted under 35 U.S.C. 154(b) by 0 days.

(21) Appl. No.: 14/394,591

(22) PCT Filed: Aug. 6, 2012

(86) PCT No.: PCT/CN2012/079725
§ 371 (c)(1),
(2), (4) Date: Oct. 15, 2014

(87) PCT Pub. No.: WO2013/155813
PCT Pub. Date: Oct. 24, 2013

(65) Prior Publication Data
US 2015/0069261 A1 Mar. 12, 2015

(30) Foreign Application Priority Data

Apr. 20, 2012 (CN) .......................... 2012 1 0118487

(51) Int. Cl.
*G21K 5/04* (2006.01)
*H01J 37/147* (2006.01)
(Continued)

(52) U.S. Cl.
CPC ............. *H01J 37/1472* (2013.01); *H01J 37/05* (2013.01); *H01J 37/147* (2013.01);
(Continued)

(58) Field of Classification Search
USPC .................. 250/492.1, 492.2, 492.21, 492.22, 250/492.23, 492.3, 396 R, 397, 396 ML
See application file for complete search history.

(56) References Cited

U.S. PATENT DOCUMENTS

| 6,137,112 A | 10/2000 | McIntyre et al. |
| 2014/0312223 A1* | 10/2014 | Peng ...................... H01J 37/05 250/298 |

FOREIGN PATENT DOCUMENTS

| CN | 1154179 | 7/1997 |
| CN | 1672235 | 9/2005 |

(Continued)

OTHER PUBLICATIONS

International Search Report for PCT/CN2012/079725 mailed Jan. 31, 2013.

*Primary Examiner* — Nicole Ippolito
(74) *Attorney, Agent, or Firm* — Nixon & Vanderhye, P.C.

(57) ABSTRACT

A method for transmitting a broadband ion beam (100) and an ion implanter adopt an analyzing magnetic field (1), a calibration magnetic field (2) and an analyzing grating (6) to transmit a broadband ion beam. If the analyzing magnetic field (1) enables the broadband ion beam (100) emitted into the analyzing magnetic field from an incident face (101) thereof to be deflected anticlockwise in a horizontal direction, the calibration magnetic field (2) enables an ion beam diffusing again after passing through the analyzing grating (6) to be deflected clockwise in the horizontal direction; if the analyzing magnetic field (1) enables the broadband ion beam (100) emitted into the analyzing magnetic field from the incident face (101) thereof to be deflected clockwise in the horizontal direction, the calibration magnetic field (2) enables an ion beam diffusing again after passing through the analyzing grating (6) to be deflected anticlockwise in the horizontal direction. The analyzing magnetic field (1) and the calibration magnetic field (2) enable the ion beam to be deflected along different directions in the horizontal direction, so that distribution of the required ions in the broadband ion beam (100) when emitted out of the calibration magnetic field (2) from an emergence face (202) thereof is the same as the distribution when being emitted into the analyzing magnetic field.

10 Claims, 4 Drawing Sheets

(51) Int. Cl.
*H01J 37/05* (2006.01)
*H01J 37/317* (2006.01)

(52) U.S. Cl.
CPC ........ *H01J 37/1475* (2013.01); *H01J 37/3171* (2013.01); *H01J 2237/055* (2013.01); *H01J 2237/057* (2013.01); *H01J 2237/152* (2013.01)

(56) References Cited

FOREIGN PATENT DOCUMENTS

| | | |
|---|---|---|
| CN | 101162679 | 4/2008 |
| CN | 101807507 | 8/2010 |
| JP | 10027565 | 1/1998 |

* cited by examiner

METHOD FOR TRANSMITTING A BROADBAND ION BEAM AND ION IMPLANTER

This application is the U.S. national phase of International Application No. PCT/CN2012/079725 filed 6 Aug. 2012 which designated the U.S. and claims priority to Chinese Patent Application No. 201210118487.4 filed 20 Apr. 2012, the entire contents of each of which are hereby incorporated by reference.

TECHNOLOGY FIELD

The present invention relates to the technology field of manufacturing semiconductor device, and specifically, to a method for transmitting a broadband ion beam in an ion implanter and an ion implanter.

BACKGROUND OF RELATED ART

An ion implanter is a key equipment in pre-procedures of manufacturing an integrated circuit, wherein ion implanting is a technology of performing doping in the vicinity of the semiconductor surface, and the purpose of ion implanting is to alter carrier concentration and conducting type of the semiconductor. In an ion implanter in the prior art, the method for transmitting a broadband ion beam includes the following steps: an analyzing magnetic field analyzes the mass of a broadband ion beam emitted into the analyzing magnetic field from an incident face thereof, so as to enable the required ions in the broadband ion beam to form a focal spot at a certain distance away from the emergence face of the analyzing magnetic field after being emitted out of the analyzing magnetic field from the emergence face thereof; an analyzing grating disposed at the focal spot selectively enables the required ions to pass therethrough; a calibration magnetic field calibrates the angle of the ion beam which diffuses again after passing through the analyzing grating and is then emitted into the calibration magnetic field from the incident face thereof, so that the ion beam which passes through the calibration magnetic field and is then emitted out of the calibration magnetic field from the emergence face thereof to have identical angular distribution; wherein the analyzing magnetic field and the calibration magnetic field are two independent magnetic fields with identical magnetic field distribution and both enable the ion beam to be deflected along the same direction in the horizontal direction, resulting in that the distribution of the emergence ion beam is not identical with that of the incident ion beam, so that the required ions in the broadband ion beam can not be implanted according to the original distribution.

Furthermore, because the analyzing magnetic field and the calibration magnetic field enable the broadband ion beam to focus only in the horizontal direction without focusing in the vertical direction, transmission efficiency of the broadband ion beam in the analyzing magnetic field and in the calibration magnetic field is low.

SUMMARY

The technical problems to be solved by the present invention is the problem that the distribution of the emergence ion beam is not identical with that of the incident ion beam after a broadband ion beam is transmitted by adopting the method for transmitting a broadband ion beam in the prior art, and the problem that the transmission efficiency of the broadband ion beam is low due to that the broadband ion beam does not focus in the vertical direction.

In order to solve the above problems, the present invention provides a method for transmitting a broadband ion beam, including the following steps: an analyzing magnetic field analyzes the mass of the broadband ion beam emitted into the analyzing magnetic field from an incident face thereof, so as to enable the required ions in the broadband ion beam to form a focal spot at a certain distance away from the emergence face after being emitted out of the analyzing magnetic field from the emergence face thereof; an analyzing grating disposed at the focal spot selectively enables the required ions to pass therethrough; and a calibration magnetic field calibrates the angle of the ion beam which diffuses again after passing through the analyzing grating and is then emitted into the calibration magnetic field from the incident face thereof, thus to enable the ion beam which passes through the calibration magnetic field and is then emitted out of the calibration magnetic field from the emergence face thereof to have identical angle distribution, wherein the analyzing magnetic field and the calibration magnetic field are two independent magnetic fields, if the analyzing magnetic field enables the broadband ion beam emitted into the analyzing magnetic field from the incident face thereof to be deflected anticlockwise in the horizontal direction, the calibration magnetic field enables the ion beam diffusing again after passing through the analyzing grating to be deflected clockwise in the horizontal direction; if the analyzing magnetic field enables the broadband ion beam emitted into the analyzing magnetic field from the incident face thereof to be deflected clockwise in the horizontal direction, the calibration magnetic field enables the ion beam diffusing again after passing through the analyzing grating to be deflected anticlockwise in the horizontal direction.

Preferably, both of the analyzing magnetic field and the calibration magnetic field are continuously uneven magnetic field; the vertical component of the analyzing magnetic field enables the required ions in the broadband ion beam emitted into the analyzing magnetic field from the incident face thereof to focus in the horizontal direction, while the horizontal component of the analyzing magnetic field enables the required ions in the broadband ion beam emitted into the analyzing magnetic field from the incident face thereof to focus in the vertical direction; and the horizontal component of the calibration magnetic field enables the ion beam diffusing again after passing through the analyzing grating to focus in the vertical direction.

Further preferably, the incident face and the emergence face of the analyzing magnetic field and the incident face and the emergence face of the calibration magnetic field are planes or cambers.

Further preferably, the analyzing magnetic field and the calibration magnetic field are disposed symmetrically or unsymmetrically with respect to the focal spot.

To solve the above problems, the present invention also provides an ion implanter, including an ion source, a source magnetic field, a lead-out electrode, an analyzing magnet, a calibration magnet, coil of analyzing magnetic field, coil of calibration magnetic field, an analyzing grating, magnetic yoke and an implanting target platform, wherein the coil of analyzing magnetic field surrounds the analyzing magnet, and the coil of calibration magnetic field surrounds the calibration magnet, the coil of analyzing magnetic field is connected to an electrical source to generate the analyzing magnetic field in the space between the upper magnetic pole and the lower magnetic pole of the analyzing magnet, the coil of calibration magnetic field is connected to an electrical source to generate the calibration magnetic field in the space between the upper magnetic pole and the lower magnetic pole of the calibration magnet, and the analyzing magnetic field and the calibration magnetic field are two independent magnetic fields;

the analyzing magnetic field analyzes the mass of the broadband ion beam emitted into the analyzing magnetic field from an incident face thereof, so that the required ions in the broadband ion beam form a focal spot at a certain distance away from the emergence face of the analyzing magnetic field after being emitted out of the analyzing magnetic field from the emergence face thereof;

the analyzing grating is disposed at the focal spot so as to selectively enable the required ions to pass therethrough;

the calibration magnetic field calibrates the angle of the ion beam which diffuses again after passing through the analyzing grating and is then emitted into the calibration magnetic field from the incident face thereof, so as to enable the ion beam which passes through the calibration magnetic field and is then emitted out of the calibration magnetic field from the emergence face thereof to have identical angle distribution;

if the analyzing magnetic field enables the broadband ion beam emitted into the analyzing magnetic field from the incident face thereof to be deflected anticlockwise in the horizontal direction, the calibration magnetic field enables the ion beam diffusing again after passing through the analyzing grating to be deflected clockwise in the horizontal direction; if the analyzing magnetic field enables the broadband ion beam emitted into the analyzing magnetic field from the incident face thereof to be deflected clockwise in the horizontal direction, the calibration magnetic field enables the ion beam diffusing again after passing through the analyzing grating to be deflected anticlockwise in the horizontal direction.

Preferably, both of the analyzing magnetic field and the calibration magnetic field are continuously uneven magnetic fields; the vertical component of the analyzing magnetic field enables the required ions in the broadband ion beam emitted into the analyzing magnetic field from the incident face thereof to focus in the horizontal direction, while the horizontal component of the analyzing magnetic field enables the required ions in the broadband ion beam emitted into the analyzing magnetic field from the incident face thereof to focus in the vertical direction; the horizontal component of the calibration magnetic field enables the ion beam diffusing again after passing through the analyzing grating to focus in the vertical direction.

Further preferably, the incident face and the emergence face of the analyzing magnetic field and the incident face and the emergence face of the calibration magnetic field are planes or cambers, and the analyzing magnetic field and the calibration magnetic field are disposed symmetrically or unsymmetrically with respect to the focal spot.

Further preferably, shielding magnetic poles are respectively disposed at the incident face and the emergence face of the analyzing magnetic field and at the emergence face of the calibration magnetic field, multiple-pole adjusters are respectively disposed at the emergence faces of the analyzing magnetic field and the calibration magnetic field, and a multiple-magnet adjuster is disposed at the incident face of the calibration magnetic field.

Further preferably, the magnetic yoke includes an upper magnetic yoke and a lower magnetic yoke, wherein the upper magnetic yoke and the lower magnetic yoke are disposed around the analyzing magnet and the calibration magnet.

Further preferably, the magnetic yoke includes a magnetic yoke of the analyzing magnet magnetic yoke and a magnetic yoke of the calibration magnet magnetic yoke, wherein the magnetic yoke of the analyzing magnet is disposed around the analyzing magnet and the magnetic yoke of the calibration magnet is disposed around the calibration magnet.

The present invention is beneficial in the following aspects compared with the prior art:

1) Because the analyzing magnetic field and the calibration magnetic field enable the ion beam to be deflected along different directions in the horizontal direction, distribution of the required ions in the broadband ion beam being emitted out of the calibration magnetic field from the emergence face thereof is the same as that of the original incident ion beam;

2) the vertical component of the continuously uneven analyzing magnetic field enables the broadband ion beam to focus in the horizontal direction, while the horizontal component of the analyzing magnetic field enables the broadband ion beam to focus in the vertical direction, whereby the transmission efficiency of the broadband ion beam in the analyzing magnetic field is effectively increased; the horizontal component of the continuously uneven calibration magnetic field enables the ion beam diffusing again after passing through the analyzing grating to focus in the vertical direction, which ensuring the transmission efficiency of the ion beam in the calibration magnetic field while enabling the emergence ion beam to better focus in the vertical direction.

DESCRIPTION OF THE MAIN REFERENCE NUMBERS IN THE ACCOMPANY DRAWINGS

Figure 1:
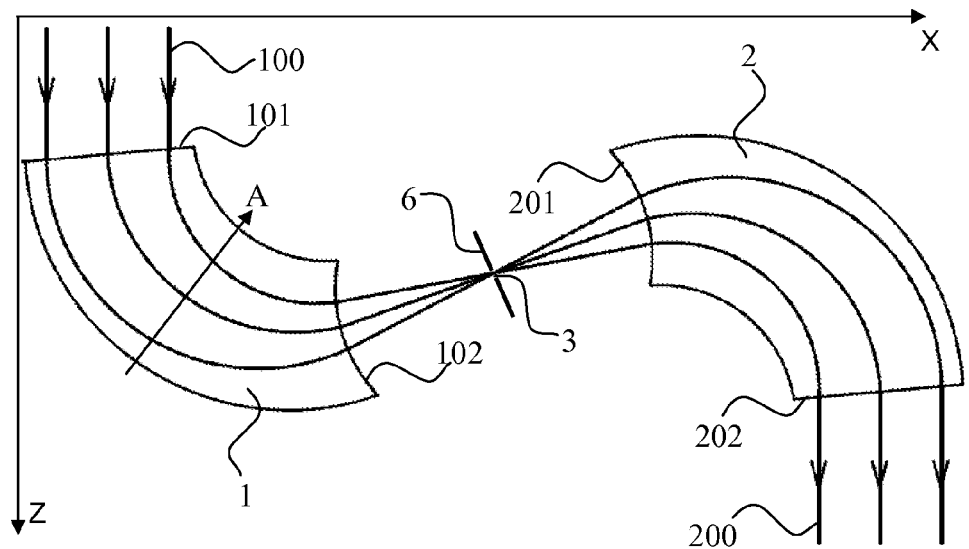
FIG. 1 is a schematic view of the setting of the analyzing magnetic field and the calibration magnetic field in the method for transmitting a broadband ion beam of the present invention.

| | |
|---|---|
| 1. Analyzing magnetic field | 2. Calibration magnetic field |
| 3. Focal spot | 4. Analyzing magnet |
| 5. Calibration magnet | 6. Analyzing grating |
| 7. Magnetic yoke | 8. Ion source |
| 9. Source magnetic field | 10. Lead-out electrode |
| 11. Implanting target platform | |
| 100. Incident ion beam | 200. Emergence ion beam |
| 101. Incident face | 102. Emergence face |
| 201. Incident face | 202. Emergence face |

-continued

401. Coil of analyzing magnetic field
402. Upper magnetic pole of the analyzing magnet
403. Lower magnetic pole of the analyzing magnet
404. Shielding magnetic pole
405. Shielding magnetic pole
406. Multiple-pole adjuster
407. Symmetric plane of the magnetic poles
501. Coil of Calibration magnetic field
502. Upper magnetic pole of the calibration magnetic field
503. Lower magnetic pole of the calibration magnetic field
504. Shielding magnetic pole
505. Multiple-magnet adjuster
506. Multiple-pole adjuster
701. Upper magnetic yoke
702. Lower magnetic yoke
703. Magnetic yoke of analyzing magnet
704. Magnetic yoke of calibration magnet

DETAILED DESCRIPTION OF EMBODIMENTS

Detailed description of the specific embodiments of the present invention will be provided below with reference to the accompany drawings.

The present invention aims to solve the problem that distribution of the Emergence ion beam is not identical with that of the incident ion beam after the ion beam is transmitted with the method for transmitting a broadband ion beam in the prior art, and also the problem of low transmission efficiency of the broadband ion beam caused by the fact that the broadband ion beam does not focus in the vertical direction.

In order to solve the above problems, firstly the present invention provides a method for transmitting a broadband ion beam, and the setting of the magnetic field adopted by this method for transmitting the broadband ion beam is shown in FIG. 1, which comprises two independent magnetic fields: an analyzing magnetic field 1 and a calibration magnetic field 2; the method for transmitting the broadband ion beam provided by the present invention includes the following steps: the analyzing magnetic field 1 analyzes the mass of the incident ion beam 100 (i.e., the broadband ion beam emitted from the analyzing magnetic field from an incident face 101 of the analyzing magnetic field 1), so that the required ions in the broadband ion beam form a focal spot 3 at a certain distance away from the emergence face 102 of the analyzing magnetic field 1 after being emitted out of the analyzing magnetic field 1 from the emergence face 102 thereof; an analyzing grating 6 disposed at the focal spot 3 selectively enables the required ions to pass therethrough; the calibration magnetic field 2 calibrates the angle of the ion beam which diffuses again after passing through the analyzing grating 6 and is then emitted into the calibration magnetic field 2 from the incident face 201 thereof, so as to enable the ion beam (i.e., the emergence ion beam 200) which passes through the calibration magnetic field 2 and then is emitted out of the calibration magnetic field 2 from the emergence face 202 thereof to have identical angular distribution; if the analyzing magnetic field 1 enables the broadband ion beam emitted into the analyzing magnetic field from the incident face 101 thereof to be deflected anticlockwise in the horizontal direction, the calibration magnetic field 2 enables the ion beam diffusing again after passing through the analyzing grating 6 to be deflected clockwise in the horizontal direction; if the analyzing magnetic field 1 enables the broadband ion beam emitted into the analyzing magnetic field from the incident face 101 thereof to be deflected clockwise in the horizontal direction, the calibration magnetic field 2 enables the ion beam diffusing again after passing through the analyzing grating 6 to be deflected anticlockwise in the horizontal direction; in order to enable that the deflected directions of the ion beam in the analyzing magnetic field 1 and in the calibration magnetic field 2 in the horizontal direction are mutually different, the field directions of the vertical component of the analyzing magnetic field and of the calibration magnetic field should be opposite.

Figure 2:
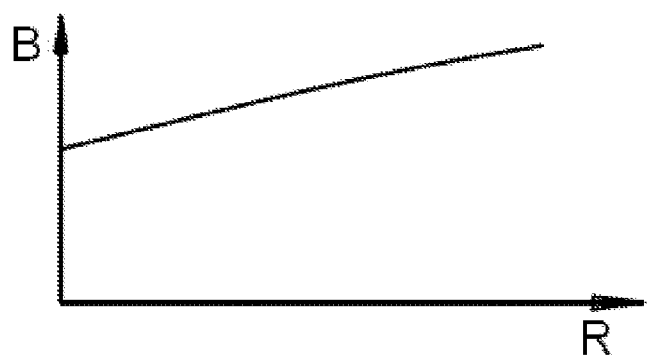
FIG. 2 is a schematic view of the distribution of the analyzing magnetic field along A direction shown in FIG. 1.
Figure 3:
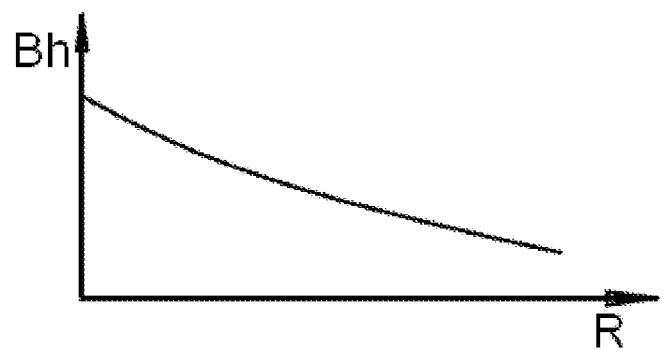
FIG. 3 is a schematic view of the distribution of the horizontal component of the analyzing magnetic field along A direction shown in FIG. 1.

In the method for transmitting a broadband ion beam according to the present invention, as a preferable aspect, both of the analyzing magnetic field 1 and the calibration magnetic field 2 are continuously uneven magnetic fields, and their distributions are shown in FIG. 2 and FIG. 3; the analyzing magnetic field 1 gradually increases along A direction (i.e., the direction of the deflection radius R of the broadband ion beam), and the horizontal component of the analyzing magnetic field 1 gradually decreases along A direction; both of the calibration magnetic field 2 and the analyzing magnetic field 1 has the same distribution of the magnetic field strength; the vertical component of the analyzing magnetic field 1 (i.e., the component vertical to X-direction and Z-direction in FIG. 1, the same hereinafter) enables the required ions in the broadband ion beam emitted into the analyzing magnetic field 1 from the incident face 101 thereof to focus in the horizontal direction, and the horizontal component (i.e., the component along X-direction and Z-direction in FIG. 1, the same hereinafter) of the analyzing magnetic field 1 enables the required ions in the broadband ion beam emitted into the analyzing magnetic field 1 from the incident face 101 thereof to focus in the vertical direction (i.e, the direction vertical to X-direction and Z-direction in FIG. 1, the same hereinafter); the horizontal component of the calibration magnetic field 2 enables the ion beam diffusing again after passing through the analyzing grating 6 to focus in the vertical direction. The vertical component of the continuously uneven analyzing magnetic field 1 enables the broadband ion beam to focus in the horizontal direction, while the horizontal component of the analyzing magnetic field 1 enables the broadband ion beam to focus in the vertical direction, whereby the transmission efficiency of the broadband ion beam in the analyzing magnetic field 1 is effectively increased; the horizontal component of the continuously uneven calibration magnetic field 2 enables the ion beam diffusing again after passing through the analyzing grating 6 to focus in the vertical direction, which ensuring the transmission efficiency of the ion beam in the calibration magnetic field 2 while enabling the emergence ion beam 200 to better focus in the vertical direction.

In the embodiment of the method for transmitting a broadband ion beam according to the present invention, as a preferable embodiment, the incident face 101 and the emergence face 102 of the analyzing magnetic field 1 can be arranged as planes or curved surfaces while being arranged in cooperation with the distribution rule of the continuously uneven magnetic field, thus to enable the analyzing magnetic field 1 to meet the requirements of the analyzing focusing characteristic of the broadband ion beam; the incident face 201 and the emergence face 202 of the calibration magnetic field 2 can be arranged as planes or curved surfaces while being arranged in cooperation with the distribution rule of the continuously uneven magnetic field, thus to enable the angle calibration in the horizontal direction by the calibration magnetic field 2 on the ion beam diffusing again after passing through the analyzing grating 6 to accord with the requirement, the calibration magnetic field 2 can be disposed symmetrically with the analyzing magnetic field 1 with respect to the focal spot 3, and when the calibration magnetic field 2 is disposed symmetrically with the analyzing magnetic field 1 with respect to the focal spot 3, the width of the emergence ion beam 200 is the same as that of the incident ion beam 100, in addition, the focusing state of the emergence ion beam 200 and that of the incident ion beam 100 are the same too; furthermore, the calibration magnetic field 2 can be disposed unsymmetrically with the analyzing magnetic field 1, so as to obtain the final emergence ion beam 200 with different aspects, such as the width, focusing state and so on.

In order to solve the above problem, the present invention also provides there embodiments of the ion implanter, and the detailed description of the three embodiments of the ion implanter will be given below with reference to the accompany drawings.

The First Embodiment

Figure 4:
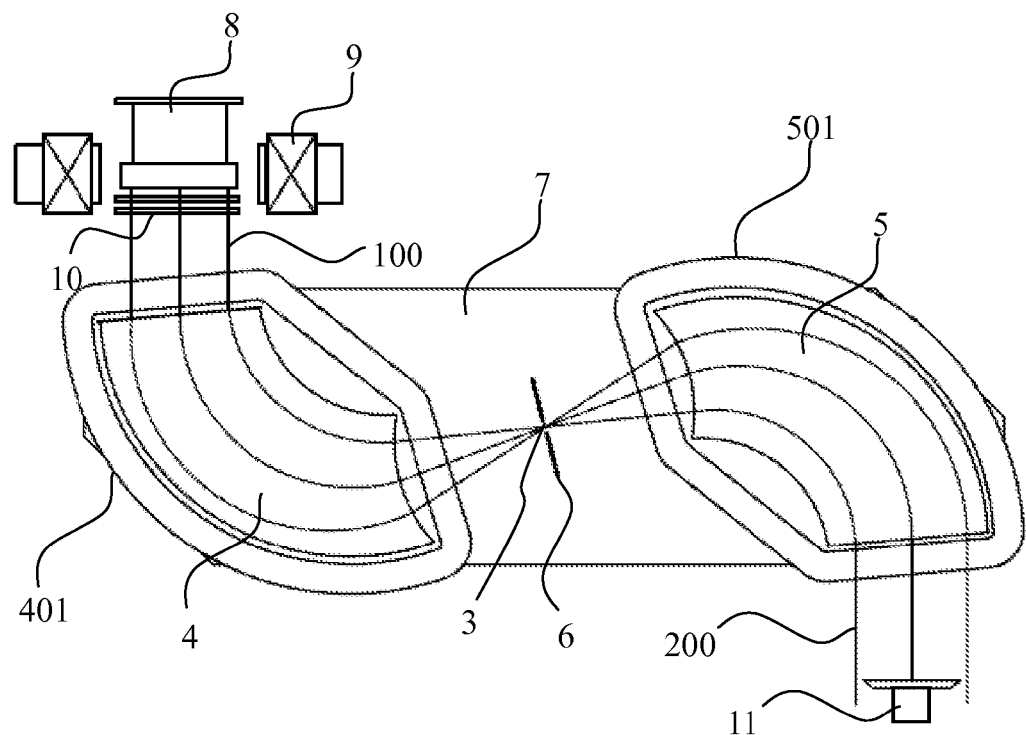
FIG. 4 is a schematic view of the structure of the ion implanter according to the first embodiment of the present invention.
Figure 5:
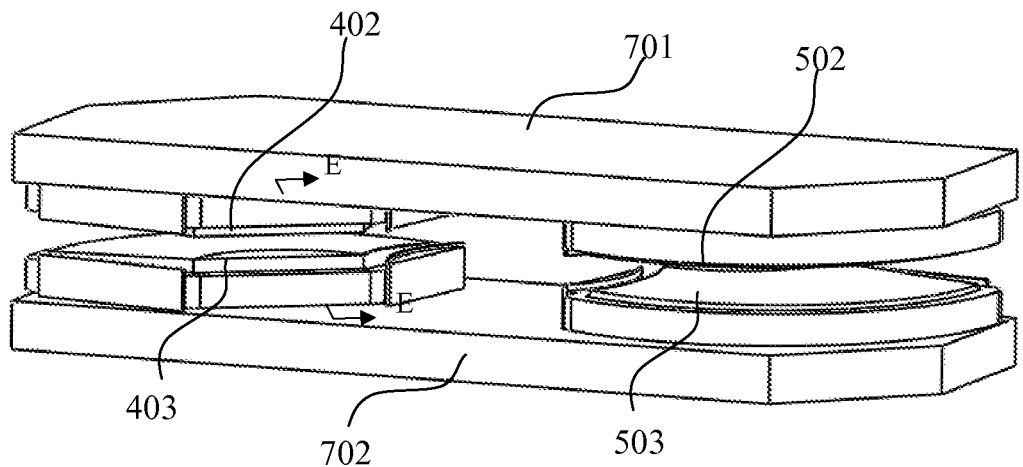
FIG. 5 is a schematic view of the arrangements of the analyzing magnet and the calibration magnet in the ion implanter shown in FIG. 4.

As shown in FIG. 4 and FIG. 5 and in combination with FIGS. 1-3, the ion implanter provided by the present embodiment comprises an ion source 8, a source magnetic field 9, lead-out electrode 10, an analyzing magnet 4, a calibration magnet 5, coil 401 of analyzing magnetic field, coil 501 of calibration magnetic field, analyzing grating 6, magnetic yoke 7 and a implanting target platform 11, wherein the coil 401 of analyzing magnetic field surrounds the analyzing magnet 4, the coil 501 of calibration magnetic field surrounds the calibration magnet 5, the coil 401 of analyzing magnetic field is connected to an electrical source to generate the analyzing magnetic field 1 in the space between the upper magnetic pole 402 and the lower magnetic pole 403 of the analyzing magnet 4, the coil 501 of calibration magnetic field is connected to an electrical source to generate the calibration magnetic field 2 in the space between the upper magnetic pole 502 and the lower magnetic pole 503 of the calibration magnet 5, and the analyzing magnetic field 1 and the calibration magnetic field 2 are two independent magnetic fields; the analyzing magnetic field 1 analyzes the mass of the incident ion beam 100 (i.e., the broadband ion beam emitted into the analyzing magnetic field 1 from the incident face 101 thereof), so as to enable the required ions in the broadband ion beam to form the focal spot 3 at a certain distance away from the emergence face 102 of the analyzing magnetic field 1 after being emitted out of the analyzing magnetic field 1 from the emergence face 102 thereof; the analyzing grating 6 selectively enabling the required ions to pass therethrough is disposed at the focal spot 3; the calibration magnetic field 2 calibrates the angle of the ion beam which diffuses again after passing through the analyzing grating 6 and is then emitted into the calibration magnetic field 2 from the incident face 201 thereof, thus to enable the ion beam (i.e., the emergence ion beam 200) which passes through the calibration magnetic field 2 and is then emitted out of the calibration magnetic field 2 from the emergence face 202 thereof to have identical angle distribution in horizontal direction; if the analyzing magnetic field 1 enables the broadband ion beam emitted into the analyzing magnetic field 1 from the incident face 101 thereof to be deflected anticlockwise in the horizontal direction, the calibration magnetic field 2 enables the ion beam diffusing again after passing through the analyzing grating 6 to be deflected clockwise in the horizontal direction; if the analyzing magnetic field 1 enables the broadband ion beam emitted into the analyzing magnetic field 1 from the incident face 101 thereof to be deflected clockwise in the horizontal direction, the calibration magnetic field 2 enables the ion beam diffusing again after passing through the analyzing grating 6 to be deflected anticlockwise in the horizontal direction. To enable the ion beam to be deflected along different directions in the horizontal direction in the analyzing magnetic field 1 and in the calibration magnetic field 2, the field directions of the vertical component of the analyzing magnetic field 1 and of the calibration magnetic field 2 should be opposite. That is, if the upper magnetic pole 402 of the analyzing magnet is N pole and the lower magnetic pole 403 of the analyzing magnet is S pole, the upper magnetic pole 502 of the calibration magnet is S pole and the lower magnetic pole 503 of the calibration magnet is N pole.

Figure 6:
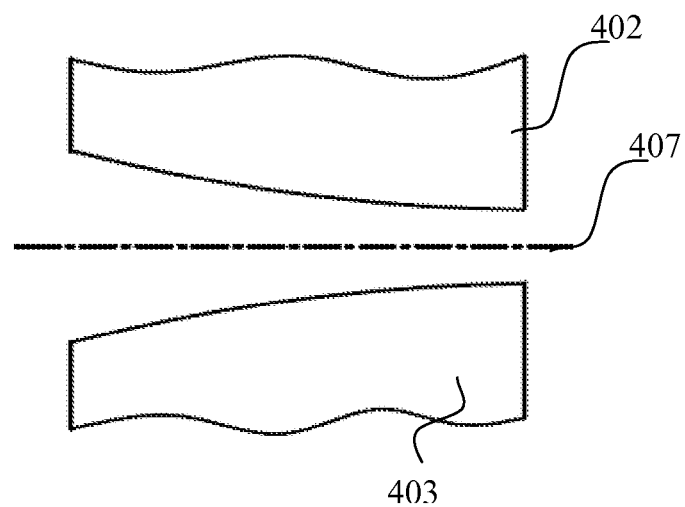
FIG. 6 is a cross-sectional schematic view of the analyzing magnet taken along E-E direction shown in FIG. 5.

In this embodiment, as the preferable scheme, both of the analyzing magnetic field 1 and the calibration magnetic field 2 are continuously uneven magnetic field, and their distributions are shown in FIG. 2 and FIG. 3; the analyzing magnetic field 1 gradually increases along A direction, while the horizontal component of the analyzing magnetic field 1 gradually decreases along A direction; correspondingly, as shown in FIG. 6, magnetic pole surface of the upper magnetic pole 402 of the analyzing magnet is symmetrical with that of the lower magnetic pole 403 of the analyzing magnet with respect to symmetric plane 407 of magnetic pole, the distance between the magnetic pole surfaces of the upper magnetic pole 402 and the lower magnetic pole 403 of the analyzing magnet gradually decreases along A direction, and both the magnetic pole surfaces of the upper magnetic pole 402 and the lower magnetic pole 403 of the analyzing magnet are taper faces; both of the calibration magnetic field 2 and the analyzing magnetic field 1 has the same distribution of the magnetic field strength; the vertical component of the analyzing magnetic field 1 enables the required ions in the broadband ion beam emitted into the analyzing magnetic field 1 from the incident face 101 thereof to focus in the horizontal direction, and the horizontal component of the analyzing magnetic field 1 enables the required ions in the broadband ion beam emitted into the analyzing magnetic field 1 from the incident face 101 thereof to focus in the vertical direction; the horizontal component of the calibration magnetic field 2 enables the ion beam diffusing again after passing through the analyzing grating 6 to focus in the vertical direction. The vertical component of the continuously uneven analyzing magnetic field 1 enables the broadband ion beam to focus in the horizontal direction, while the horizontal component of the analyzing magnetic field 1 enables the broadband ion beam to focus in the vertical direction, whereby the transmission efficiency of the broadband ion beam in the analyzing magnetic field 1 is effectively increased; the horizontal component of the continuously uneven calibration magnetic field 2 enables the ion beam diffusing again after passing through the analyzing grating 6 to focus in the vertical direction, ensuring the transmission efficiency of the ion beam in the calibration magnetic field 2, and at the same time enabling the emergence ion beam 200 to better focus in the vertical direction.

In the present embodiment, as the preferable scheme, the incident face 101 and the emergence face 102 of the analyzing magnetic field 1 can be arranged as planes or curved surfaces while being arranged in cooperation with the distribution rule of the continuously uneven magnetic field, thus to enable the analyzing magnetic field 1 to meet the requirements of the analyzing focusing characteristic of the broadband ion beam; the incident face 201 and the emergence face 202 of the calibration magnetic field 2 can be arranged as planes or curved surfaces while being arranged in cooperation with the distribution rule of the continuously uneven magnetic field, thus to enable the angle calibration in the horizontal direction done by the calibration magnetic field 2 on the ion beam diffusing again after passing through the analyzing grating 6 to accord with the requirement, the calibration magnetic field 2 can be disposed symmetrically with the analyzing magnetic field 1 with respect to the focal spot 3, and when the calibration magnetic field 2 is disposed symmetrically with the analyzing magnetic field 1 with respect to the focal spot 3, the width and the focusing state of the emergence ion beam 200 are the same as that of the incident ion beam 100; furthermore, the calibration magnetic field 2 can be disposed unsymmetrically with the analyzing magnetic field 1, so as to obtain final emergence ion beam 200 with different aspects, such as the width, focusing state and so on.

Magnetic yoke 7 includes an upper magnetic yoke 701 and a lower magnetic yoke 702, which are disposed around the analyzing magnet 4 and calibration magnet 5.

The Second Embodiment

Figure 7:
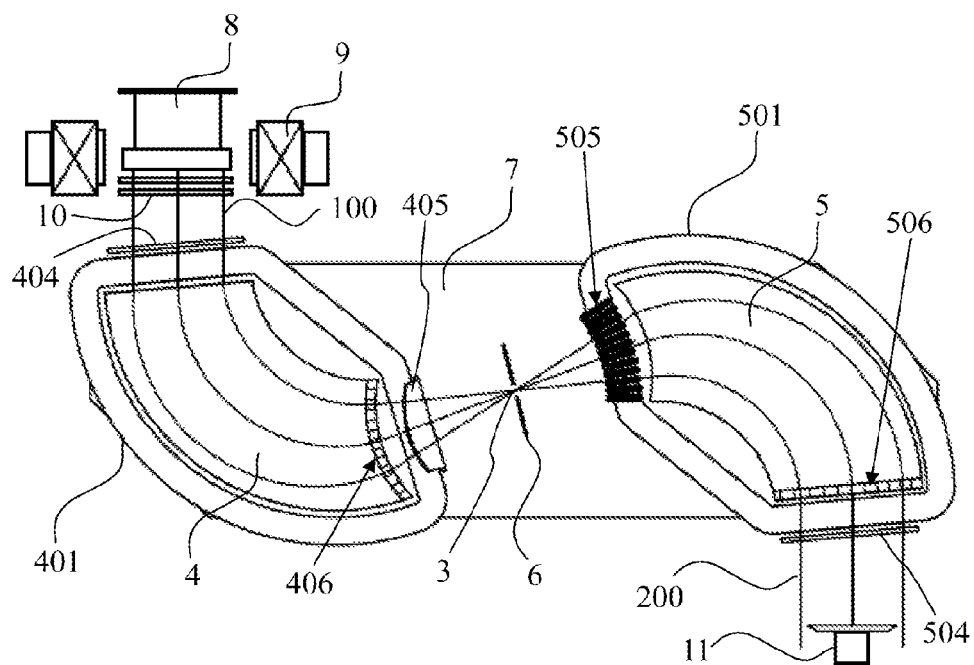
FIG. 7 is a schematic view of the structure of the ion implanter according to the second embodiment of the present invention.

As shown in FIG. 7, and in combination with FIGS. 1-3, the differences between the ion implanters in the second embodiment and the first embodiment are: shielding magnetic poles 404, 405 and 504 are respectively disposed at the incident face 101 and the emergence face 102 (respectively corresponding to the entrance and exit of the analyzing magnet 4) of the analyzing magnetic field 1 and at the emergence face 202 (corresponding to the exit of the calibration magnet 5) of the calibration magnetic field 2; multiple-pole adjusters 406, 506 and 505 are respectively disposed at the emergence face 102 (corresponding to the exit of the analyzing magnet 4) of the analyzing magnetic field 1 and the emergence face 202 (corresponding to the exit of the calibration magnet 5) of the calibration magnetic field 2; and multiple-magnet adjuster 505 is disposed at the incident plane 201 (corresponding to the entrance of the calibration magnet 5) of the calibration magnetic field 2.

Due to the disposing of several shielding magnetic poles 404, 405 and 504, influence of the focusing of the broadband ion beam in the edge field can be reduced; the multiple-pole adjuster 406 disposed at the emergence face 102 of the analyzing magnetic field 1 can adjust and analyze in real time the position and shape of the focal spot, which ensuring the transmission efficiency of the ion beam and the analyzing resolution; the multiple-magnet adjusters 505 respectively disposed at the incident face 201 and the emergence face 202 of the calibration magnetic field 2 are in cooperation with the multiple-pole adjuster 506, which adjusting the consistence and uniformity of the beam angle of the emergence ion beam 200.

The Third Embodiment

Figure 8:
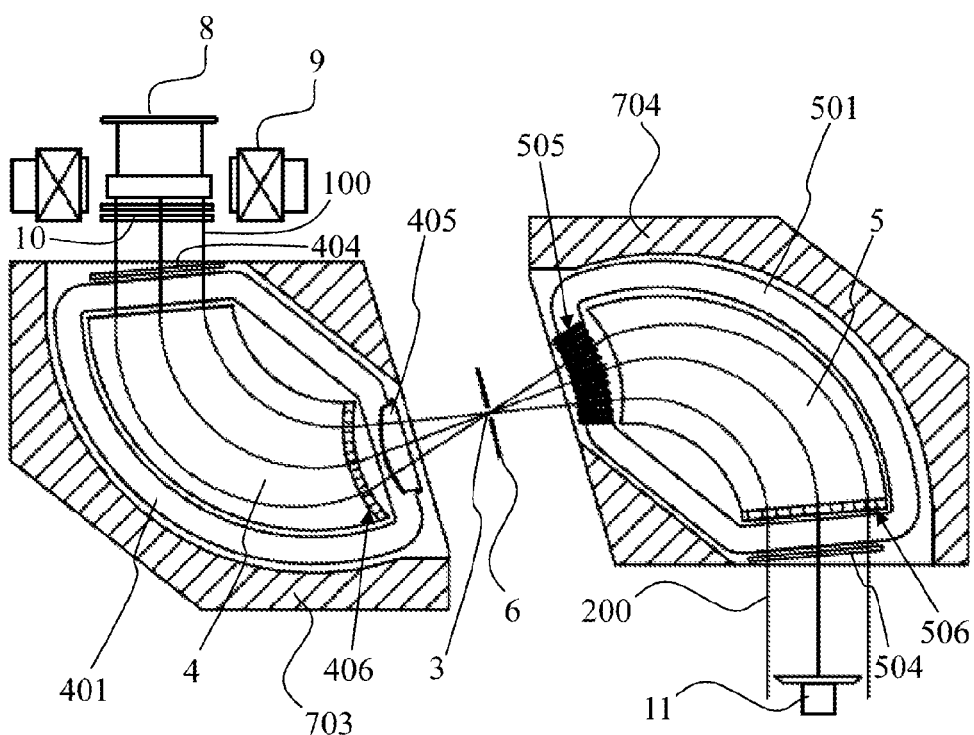
FIG. 8 is a schematic view of the structure of the ion implanter according to the third embodiment of present invention.

As shown in FIG. 8, the differences between the ion implanters in the third embodiment and the second embodiment are: the magnetic yoke 7 includes magnetic yoke 703 of the analyzing magnet and magnetic yoke 704 of the calibration magnet, wherein the magnetic yoke 703 of analyzing magnet is disposed around the analyzing magnet 4, and the magnetic yoke 704 of calibration magnet is disposed around the calibration magnet 5; in the present embodiment, the analyzing magnet 4 and the calibration magnet 5 are separated into two independent magnet structures.

The broadband ion beam and the ion implanter in the present invention is beneficial in the following aspects:

1) Because the analyzing magnetic field and the calibration magnetic field enable the ion beam to be deflected along different directions in the horizontal direction, distribution of the required ions in the broadband ion beam being emitted out of the calibration magnetic field from the emergence face thereof is the same as that of the original incident ion beam.

2) the vertical component of the continuously uneven analyzing magnetic field enables the broadband ion beam to focus in the horizontal direction, while the horizontal component of the analyzing magnetic field enables the broadband ion beam to focus in the vertical direction, whereby the transmission efficiency of the broadband ion beam in the analyzing magnetic field is effectively increased; the horizontal component of the continuously uneven calibration magnetic field enables the ion beam diffusing again after passing through the analyzing grating to focus in the vertical direction, which ensuring the transmission efficiency of the ion beam in the calibration magnetic field while enabling the emergence ion beam to better focus in the vertical direction.

The above embodiments are only exemplary embodiments of the present invention and are not intended to limit the present invention. The scope of the present invention is defined by the claims appended. Those skilled in the art can make various modifications or equivalents within the spirit and the scope of the present invention, and these modifications or equivalents should be considered to be falling within the scope of the present invention

What is claimed is:

1. A method for transmitting a broadband ion beam, including the following steps: the analyzing magnetic field analyzes the mass of the broadband ion beam emitted into the analyzing magnetic field from an incident face thereof, so as to enable the required ions in the broadband ion beam to form a focal spot at a certain distance away from the emergence face thereof after being emitted out of the analyzing magnetic field from the emergence face thereof; an analyzing grating disposed at the focal spot selectively enables the required ions to pass therethrough; and a calibration magnetic field calibrates the angle of the ion beam which diffuses again after passing through the analyzing grating and is then emitted into the calibration magnetic field from the incident face thereof, thus to enable the ion beam which passes through the calibration magnetic field and is then emitted out of the calibration magnetic field from the emergence face thereof to have identical angle distribution, wherein the analyzing magnetic field and the calibration magnetic field are two independent magnetic fields, characterized in that, if the analyzing magnetic field enables the broadband ion beam emitted into the analyzing magnetic field from the incident face thereof to be deflected anticlockwise in the horizontal direction, the calibration magnetic field enables the ion beam diffusing again after passing through the analyzing grating to be deflected clockwise in the horizontal direction; if the analyzing magnetic field enables the broadband ion beam emitted into the analyzing magnetic field from the incident face thereof to be deflected clockwise in the horizontal direction, the calibration magnetic field enables the ion beam diffusing again after passing through the analyzing grating to be deflected anticlockwise in the horizontal direction.

2. The method for transmitting a broadband ion beam according to claim 1, characterized in that both of the analyzing magnetic field and the calibration magnetic field are continuously uneven magnetic fields; the vertical component of the analyzing magnetic field enables the required ions in the broadband ion beam emitted into the analyzing magnetic field from the incident face thereof to focus in the horizontal direction, while the horizontal component of the analyzing magnetic field enables the required ions in the broadband ion beam emitted into the analyzing magnetic field from the incident face thereof to focus in the vertical direction; and the horizontal component of the calibration magnetic field enables the ion beam diffusing again after passing through the analyzing grating to focus in the vertical direction.

3. The method for transmitting a broadband ion beam according to claim 2, characterized in that the incident face and the emergence face of the analyzing magnetic field and the incident face and the emergence face of the calibration magnetic field are planes or cambers.

4. The method for transmitting a broadband ion beam according to claim 2, characterized in that the analyzing magnetic field and the calibration magnetic field are disposed symmetrically or unsymmetrically with respect to the focal spot.

5. An ion implanter, including an ion source, a source magnetic field, a lead-out electrode, an analyzing magnet, a calibration magnet, coil of analyzing magnetic field, coil of calibration magnetic field, an analyzing grating, magnetic yoke and an implanting target platform, wherein the coil of analyzing magnetic field surrounds the analyzing magnet, the coil of calibration magnetic field surrounds the calibration magnet, the coil of analyzing magnetic field is connected to an electrical source to generate the analyzing magnetic field in the space between the upper magnetic pole and the lower magnetic pole of the analyzing magnet, the coil of calibration magnetic field is connected to an electrical source to generate the calibration magnetic field in the space between the upper magnetic pole and the lower magnetic pole of the calibration magnet, and the analyzing magnetic field and the calibration magnetic field are two independent magnetic fields;

the analyzing magnetic field analyzes the mass of the broadband ion beam emitted into the analyzing magnetic field from an incident face thereof, so that the required ions in the broadband ion beam form a focal spot at a certain distance away from the emergence face of the analyzing magnetic field after being emitted out of the analyzing magnetic field from the emergence face thereof;

the analyzing grating is disposed at the focal spot so as to selectively enable the required ions to pass therethrough;

the calibration magnetic field calibrates the angle of the ion beam which diffuses again after passing through the analyzing grating and is then emitted into the calibration magnetic field from the incident face thereof, so as to enable the ion beam which passes through the calibration magnetic field and is then emitted out of the calibration magnetic field from the emergence face thereof to have identical angle distribution;

characterized in that, if the analyzing magnetic field enables the broadband ion beam emitted into the analyzing magnetic field from the incident face thereof to be deflected anticlockwise in the horizontal direction, the calibration magnetic field enables the ion beam diffusing again after passing through the analyzing grating to be deflected clockwise in the horizontal direction; if the analyzing magnetic field enables the broadband ion beam emitted into the analyzing magnetic field from the incident face thereof to be deflected clockwise in a horizontal direction, the calibration magnetic field enables the ion beam diffusing again after passing through the analyzing grating to be deflected anticlockwise in the horizontal direction.

6. The ion implanter according to claim 5, characterized in that, both of the analyzing magnetic field and the calibration magnetic field are continuously uneven magnetic fields; the vertical component of the analyzing magnetic field enables the required ions in the broadband ion beam emitted into the analyzing magnetic field from the incident face thereof to focus in the horizontal direction, while the horizontal component of the analyzing magnetic field enables the required ions in the broadband ion beam emitted into the analyzing magnetic field from the incident face thereof to focus in the vertical direction; the horizontal component of the calibration magnetic field enables the ion beam diffusing again after passing through the analyzing grating to focus in the vertical direction.

7. The ion implanter according to claim 6, characterized in that the incident face and the emergence face of the analyzing magnetic field and the incident face and the emergence face of the calibration magnetic field are planes or cambers, and the analyzing magnetic field and the calibration magnetic field are disposed symmetrically or unsymmetrically with respect to the focal spot.

8. The ion implanter according to claim 6, characterized in that shielding magnetic poles are respectively disposed at the incident face and emergence face of the analyzing magnetic field and at the emergence face of the calibration magnetic field, multiple-pole adjusters are respectively disposed at the emergence faces of the analyzing magnetic field and the calibration magnetic field, and a multiple-magnet adjuster is disposed at the incident face of the calibration magnetic field.

9. The ion implanter according to claim 5, characterized in that the magnetic yoke includes an upper magnetic yoke and a lower magnetic yoke, and the upper magnetic yoke and the lower magnetic yoke are disposed around the analyzing magnet and the calibration magnet.

10. The ion implanter according to claim 5, characterized in that the magnetic yoke includes a magnetic yoke of the analyzing magnet and a magnetic yoke of the calibration magnet, wherein the magnetic yoke of the analyzing magnet is disposed around the analyzing magnet and the magnetic yoke of the calibration magnet is disposed around the calibration magnet.

* * * * *